(12) United States Patent
Anceau

(10) Patent No.: US 7,902,605 B2
(45) Date of Patent: Mar. 8, 2011

(54) RESISTOR IN AN INTEGRATED CIRCUIT

(76) Inventor: Christine Anceau, Saint Roch (FR)

( * ) Notice: Subject to any disclaimer, the term of this patent is extended or adjusted under 35 U.S.C. 154(b) by 0 days.

(21) Appl. No.: 12/096,272

(22) PCT Filed: Dec. 5, 2006

(86) PCT No.: PCT/FR2006/051280
§ 371 (c)(1),
(2), (4) Date: Oct. 17, 2008

(87) PCT Pub. No.: WO2007/066037
PCT Pub. Date: Jun. 14, 2007

(65) Prior Publication Data
US 2009/0127658 A1 May 21, 2009

(30) Foreign Application Priority Data
Dec. 6, 2005 (FR) .................................. 05 53742

(51) Int. Cl.
*H01L 29/76* (2006.01)
*H01L 21/336* (2006.01)
(52) U.S. Cl. ....................... 257/364; 438/284
(58) Field of Classification Search ............... 438/244, 438/284, 330, 386; 257/296, 364, E21.004–E21.007
See application file for complete search history.

(56) References Cited

U.S. PATENT DOCUMENTS

| | | | | |
|---|---|---|---|---|
| 5,049,521 A * | 9/1991 | Belanger et al. | ............... | 438/295 |
| 5,861,649 A * | 1/1999 | Yoshida et al. | ............... | 257/301 |
| 6,724,021 B2 * | 4/2004 | Van Dalen et al. | ........... | 257/213 |
| 6,833,079 B1 | 12/2004 | Giordani | | |
| 7,488,682 B2 * | 2/2009 | Yang | .............................. | 438/627 |
| 7,606,056 B2 * | 10/2009 | Pellizzer et al. | ................. | 365/63 |
| 2005/0263850 A1 | 12/2005 | Aitken et al. | | |

FOREIGN PATENT DOCUMENTS
EP 0 391 123 A 10/1990
JP 58135662 A 8/1983

OTHER PUBLICATIONS

International Search Report from corresponding International Application No. PCT/FR2006/051280 filed Dec. 6, 2006. Search report dated Apr. 3, 2007.
Abbas S.A., *Polysilicon Vertical Resistors*, IBM Technical Disclosure Bulletin, IBM Corp. New York, vol. 23, No. 5, Oct. 1980, p. 1894, XP000806034.

* cited by examiner

*Primary Examiner* — Calvin Lee
(74) *Attorney, Agent, or Firm* — Lisa K. Jorgenson; James H. Morris; Wolf, Greenfield & Sacks, P.C.

(57) ABSTRACT

A resistive element having two vertical resistive portions placed in two holes formed in the upper portion of a substrate and a horizontal resistive portion placed in a buried cavity connecting the bottoms of the holes.

16 Claims, 3 Drawing Sheets

RESISTOR IN AN INTEGRATED CIRCUIT

FIELD OF THE INVENTION

The present invention generally relates to a resistor, and more specifically to a resistor in an integrated circuit.

DISCUSSION OF THE RELATED ART

An example of a resistor currently used in integrated circuits is a resistor having the shape of a polysilicon or metal (TaN) strip placed above a silicon wafer and insulated therefrom by an insulating layer.

Another example of a known resistor is a P- or N-type doped silicon portion formed in the upper portion of a silicon wafer.

A disadvantage of such resistors is that the wafer surface areas needed can be very large.

SUMMARY OF THE INVENTION

An object of at least one embodiment of the present invention is to provide a resistor structure taking up a small surface area of a silicon wafer.

At least one embodiment of the present invention further provides a method for manufacturing such a resistor.

To achieve these and other objects, at least one embodiment of the present invention provides a resistive element comprising two vertical resistive portions placed in two holes formed in the upper portion of a substrate and a horizontal resistive portion placed in a buried cavity connecting the bottoms of the holes.

At least one embodiment of the present invention further provides a resistor comprising several resistive elements such as those described hereabove connected to one another by resistive strips placed on the substrate.

According to one embodiment of the resistive element, the two holes connected by the buried cavity form a conduit, the vertical and horizontal resistive portions being formed by an insulated resistive layer covering the conduit walls.

According to another embodiment of the resistive element, the substrate is the silicon wafer, said resistive layer being separated from the substrate by an insulating layer such as a silicon oxide layer.

According to another embodiment of the resistive element, the conduit is filled with a filling material such as polysilicon.

According to another embodiment of the resistive element, the resistive layer and the filling material are separated by an insulating layer such as a silicon oxide layer.

According to another embodiment of the resistive element, the resistive layer is formed of polysilicon or of a metal.

According to another embodiment of the present invention further provides a method for forming a resistive element in a substrate comprising the steps of: forming, by anisotropic etch, two holes in the upper portion of a substrate; forming, by isotropic etch at the bottom of the holes, a cavity connecting the bottom of the two holes, the holes and the cavity forming a conduit; and performing a conformal deposition of a resistive layer against the conduit walls.

According to an embodiment of the above-mentioned method, the method comprises, prior to the conformal deposition of the resistive layer, a step of conformal deposition of a first insulating layer, and further comprises a step of conformal deposition of a second insulating layer covering said resistive layer, as well as a step of filling of the conduit with a filling material such as polysilicon.

According to an embodiment of the above-mentioned method, on forming of the resistive layer against the walls of the conduit, a resistive layer forms at the substrate surface, the method further comprising a step of etching the resistive layer at the substrate surface to form resistive strips.

BRIEF DESCRIPTION OF THE DRAWINGS

The foregoing and other objects, features, and advantages of the present invention will be discussed in detail in the following non-limiting description of specific embodiments in connection with the accompanying drawings.

DETAILED DESCRIPTION

Figure 1A:
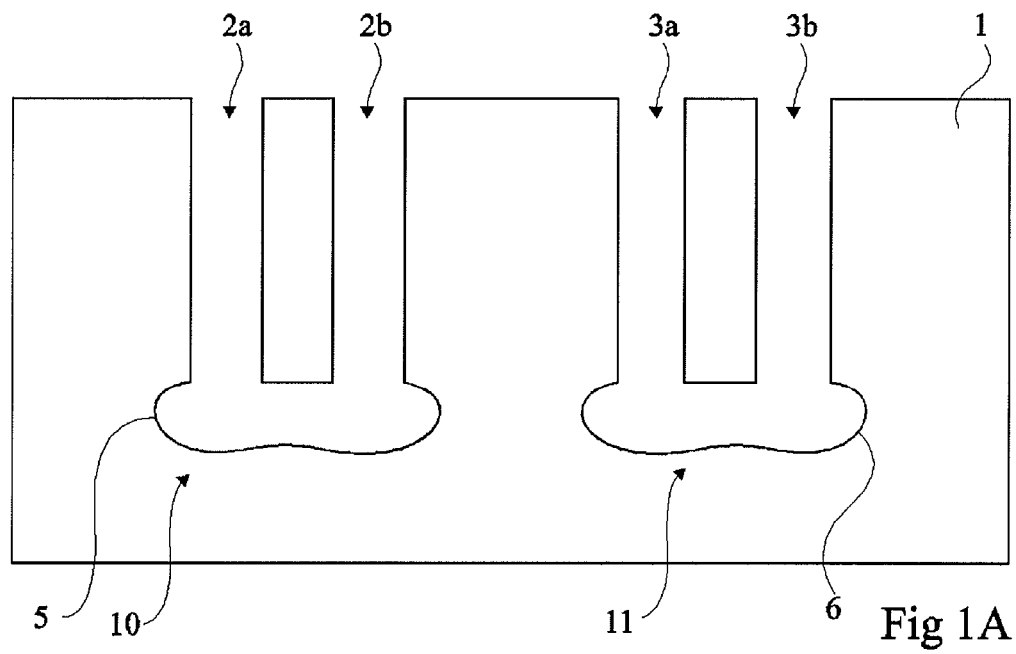
FIGS. 1A, 2, 3, 4A, and 5 are cross-section views

For clarity, the same elements have been referred to with the same reference numerals in the different drawings and, further, as usual in the representation of semiconductor components, the various drawings are not to scale.

A resistor according to the present invention may be called a three-dimensional, "3D," resistor. The resistor is formed of an assembly of elementary resistive elements formed in the upper portion of a substrate, such as a silicon wafer. A resistive element comprises two "vertical" resistive portions, placed in two holes formed in the upper substrate portion and a small "horizontal" resistive portion placed in a buried cavity connecting the bottoms of the two holes.

A method for forming such a resistor is described hereafter in relation with FIGS. 1 to 6.

Figure 1B:
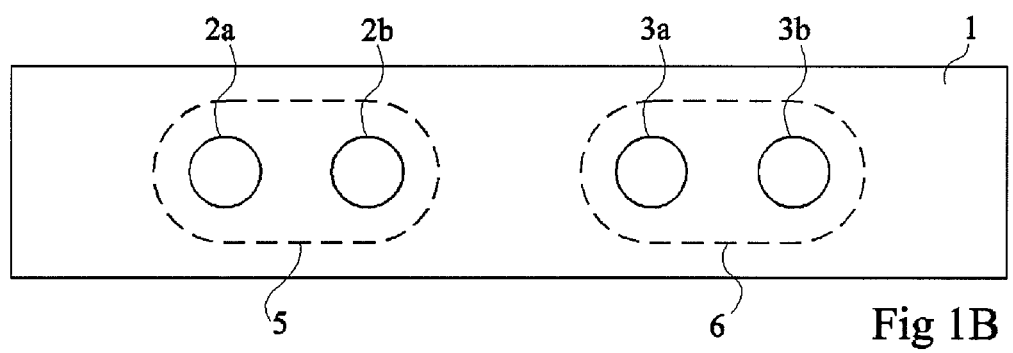
FIGS. 1B and 4B are top views of structures obtained in successive steps of a method for forming a resistor according to the present invention.

In an initial step, illustrated in FIGS. 1A and 1B, an anisotropic etch of a substrate 1 is performed to form pairs of holes 2a/2b and 3a/3b in the upper portion of substrate 1. Substrate 1 for example is a silicon wafer. The etching may be performed according to a deep reactive ion etching (DRIE). Substrate 1 is biased so that the substrate etching by ionized gas molecules is performed "vertically". The used gas mixture may comprise a "passivating" gas which reacts with the substrate to form a thin insulating layer. A mixture of an "etchant" gas such as $SF_6$ and a passivating gas such as $C_4F_8$ is for example used. When a gas mixture comprising a passivating gas is used, a thin insulating layer forms on the hole walls along their forming.

An isotropic etch of substrate 1 is then performed, at the bottom of holes 2a/2b and 3a/3b, to form "buried" cavities at the bottom of each of the holes. The two holes of each pair are placed close enough to each other for the buried cavities formed at the bottom of each of the holes to connect to form a single buried cavity. Thus, holes 2a and 2b are connected by a buried cavity 5 and holes 3a and 3b are connected by a buried cavity 6. This isotropic etch may be performed according to a reactive ion etching substantially identical to that used to form the holes, except that substrate 1 is no longer biased and that the amount of passivating gas may be smaller.

As visible in FIG. 1B, holes 2a, 2b, 3a, 3b have in this example a substantially cylindrical shape. Buried cavities 5 and 6, having a substantially oval shape in top view, are shown in dotted lines around hole pairs 2a/2b and 3a/3b.

It is considered hereafter that holes 2a, 2b and buried cavity 5 form a conduit 10. Similarly, holes 3a, 3b and buried cavity 6 form a conduit 11.

Figure 2:
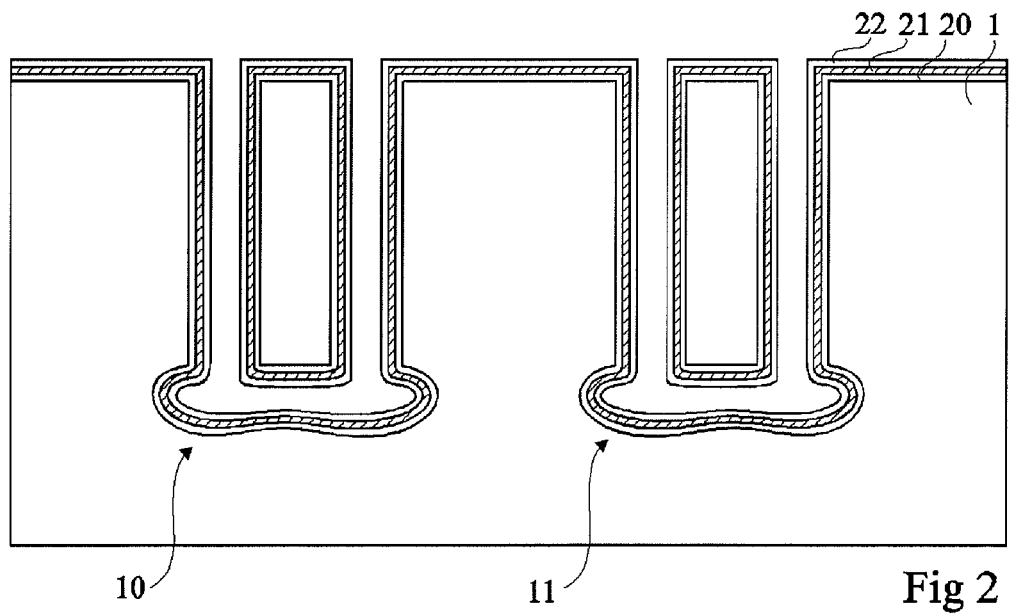

At the next step, illustrated in FIG. 2, several conformal depositions of a thin insulating layer 20, of a resistive layer 21, and of an insulating layer 22 are successively deposited on the previously-obtained structure. These three thin superposed layers cover the walls of conduits 10 and 11 as well as the upper surface of substrate 1.

Insulating layers 20 and 22 may be obtained by a conventional thermal oxidation method or by a low-pressure chemical vapor deposition, or LPCVD. Insulating layer 20 and 22 are for example formed of silicon oxide.

Resistive layer 21 may be formed of polysilicon, doped or undoped, or of a metal such as tantalum nitride. Such resistive layers may be deposited according to an LPCDV method or according to an atomic layer chemical vapor deposition, or ALCVD.

Figure 3:
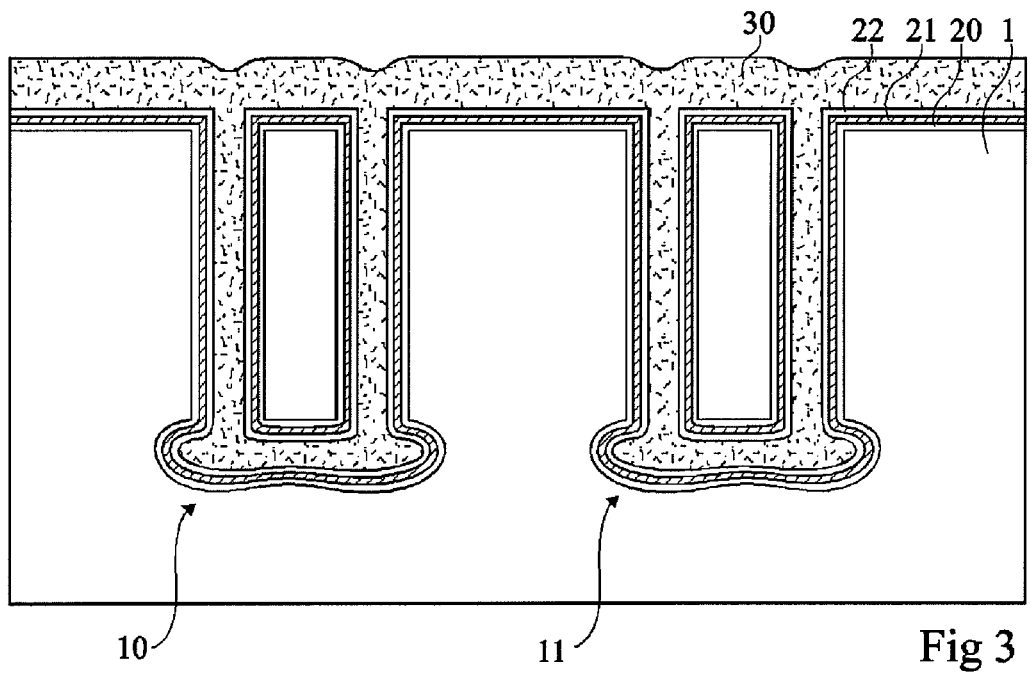

At the next step, illustrated in FIG. 3, conduits 10 and 11 are filled with a filling material 30 such as polysilicon. In this example, filling material 30 also covers the surface of substrate 1.

Figure 4A:
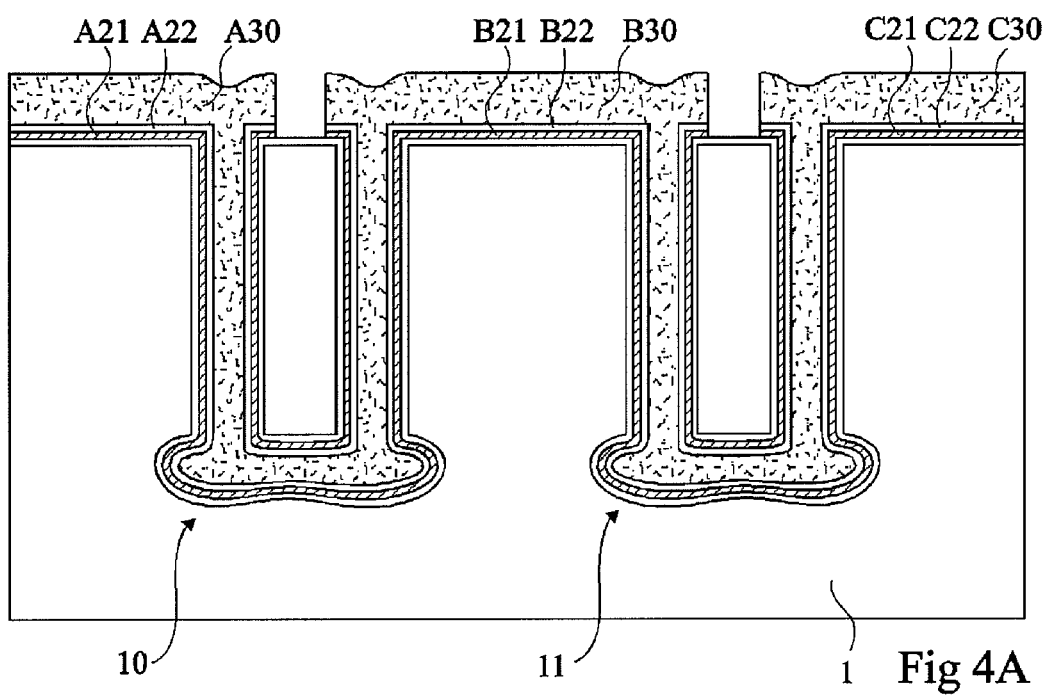
Figure 4B:
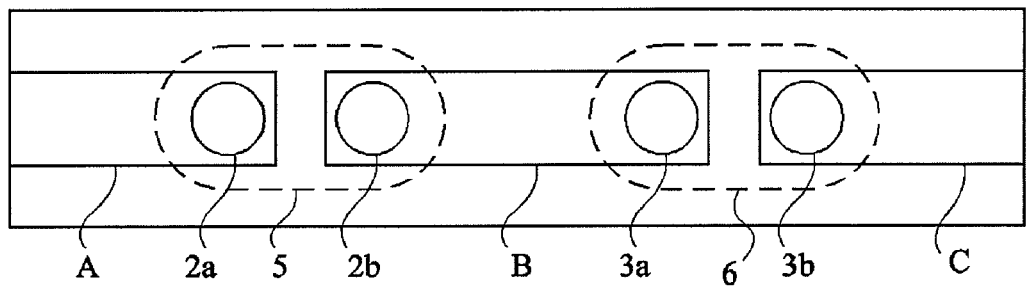

At the next step, illustrated in FIGS. 4A and 4B, filling material 30, insulating layer 22, and resistive layer 21 are successively etched to expose the surface of insulating layer 20, while keeping strips A, B, and C of these various materials. The strips are thus electrically insulated from one another. Each strip A, B, and C is formed of a stacking of a portion A21, B21, C21 of resistive layer 21, of a portion A22, B22, C22 of insulating layer 22, and of a portion A30, B30, C30 of filling material 30. The ends of central strip B cover holes 2b and 3a of conduits 10 and 11. One end of outer strip A covers hole 2a of conduit 10 and one end of outer strip B covers hole 3b of conduit 11. Strips A, B, and C are in this example aligned in top view.

Figure 5:
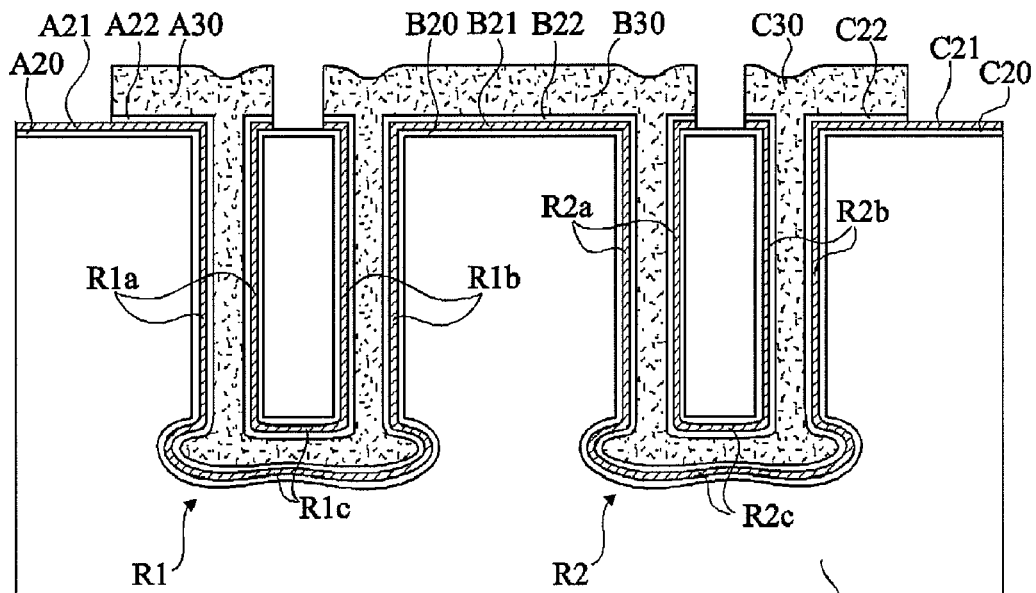

At the next step, illustrated in FIG. 5, outer strips A and C are partially etched on the side opposite to holes 2a and 3b. Filling material 30 and insulating layer 21 are successively etched to enable access to the ends of resistive portions A21 and C21 of strips A and C.

The resistor shown in FIG. 5 comprises two resistive elements R1 and R2 respectively formed in conduits 10 and 11. The substantially cylindrical portions of resistive layer 21 placed in holes 2a/2b and 3a/3b form vertical resistive portions R1a/R1b and R2a/R2b. The oblong portions of resistive layer 21 placed in buried cavities 5 and 6 form "horizontal" resistive portions R1c and R2c.

It should be noted that in the case where substrate 1 is formed of an insulating material such as glass, insulating layer 20 is not necessary.

Figure 6:
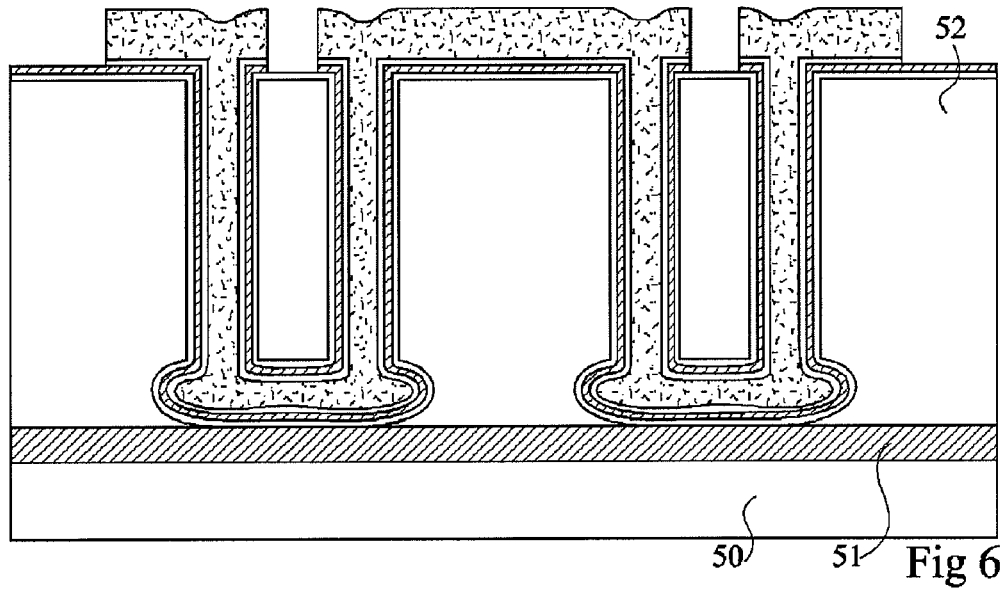
FIG. 6 is a cross-section view of another example of a resistor obtained according to a variation of the method described in relation with FIGS. 1 to 5.

FIG. 6 illustrates a resistor obtained according to a variation of the above-described method and more specifically according to an alternative embodiment of the initial etch steps implemented to form conduits 10 and 11. In this example, the substrate used is an SOI-type (silicon-on-insulator) wafer, comprising a thick silicon layer 50 covered with a thin insulating layer 51, itself covered with a silicon layer 52. The forming of the conduits comprises, in this embodiment, the etching of holes across the entire thickness of silicon layer 52 according to an anisotropic etch method, followed by the extension of this same etching, once the holes have been formed, to form buried cavities of connection between the bottom of the holes. The etching of the buried cavities is performed by favoring a normally parasitic phenomenon, of lateral "ricochet" etch on thin insulating layer 51, this phenomenon being known as the "notching".

Figure 7:
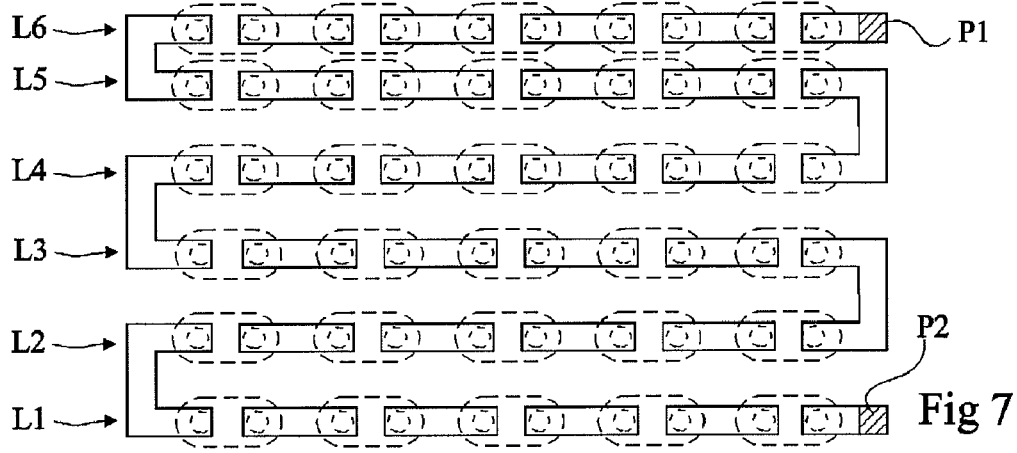
FIG. 7 is a top view of an example of a resistor according to an embodiment of the present invention.

FIG. 7 is a top view of an example of a resistor according to an embodiment of the present invention comprising an assembly of resistive elements formed in the upper portion of a substrate, such as those described hereabove. The resistive elements are connected to one another by conductive strips placed on the substrate. The conductive strips are shown in full lines, the hole openings are shown by circles in dotted lines placed under the ends of the conductive strips, and the buried cavities are shown by ovals in dotted lines surrounding two hole openings.

The resistive elements are arranged in rows L1 to L6 which comprise 5 resistive elements each, row L1 being shown at the bottom of the drawing. The resistive elements of a same row are aligned, that is, the hole openings and the buried cavities in which the resistive elements are formed are aligned with respect to one another. Similarly, the conductor strips interconnecting resistive elements of a same row are aligned and have a substantially rectangular shape. The elements of a row are connected to those of a neighboring row by a resistive connection strip, U-shaped in this example. Three resistive connection strips connect rows L1/L2, L3/L4, and L5/L6 to the left thereof and two resistive connection strips connect rows L2/L3 and L4/L5 to the right thereof. The resistor thus has in top view the shape of a serpentine. The right ends of the rightmost resistive strips of rows L1 and L6 are the ends of the serpentine and form contact pads P1 and P2 of the resistor.

As a non-limiting indication, the resistor shown in FIG. 7 is formed of resistive elements, each exhibiting the following features:

hole diameter: 1 µm;
hole depth: 50 µm;
interval between holes: 2 µm;
maximum diameter of the buried cavity: 3.5 µm;
maximum width of the resistive strips: 2 µm; and
the resistive elements are placed with respect to one another as follows:
interval between the holes of resistive elements of neighboring rows: 4 µm;
interval between two neighboring holes of two successive resistive elements of a same row: 4 µm.

It should further be noted that for a given resistance value, the surface area taken up by a resistor according to an embodiment of the present invention is much smaller, from 5 to 10 times as small, as that taken up by a conventional resistor formed at the surface of a silicon wafer.

Of course, the present invention is likely to have various alterations, modifications, and improvements which will readily occur to those skilled in the art. In particular, those skilled in the art can devise various forms of resistors formed of differently-arranged elementary resistive elements.

Further, those skilled in the art can devise other methods for forming a resistive element according to the present invention. Previously-formed insulated conduits may for example be filled with a resistive material such as polysilicon.

Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A resistive element comprising two vertical resistive portions disposed in two holes formed in the upper portion of a substrate and a horizontal resistive portion disposed in a buried cavity connecting the bottoms of the holes, the vertical and horizontal resistive portions comprising an insulated resistive layer covering the walls of the holes and of the buried cavity.

2. A resistor comprising several resistive elements according to claim 1 connected to one another by resistive strips placed on the substrate and formed from portions of said resistive layer.

3. The resistive element of claim 1, wherein the substrate is a silicon wafer, said resistive layer being separated from the substrate by an insulating layer.

4. The resistive element of claim 3, wherein the insulating layer comprises silicon oxide.

5. The resistive element of claim 1, wherein the holes and buried cavity are filled with a filling material.

6. The resistive element of claim 5, wherein the resistive layer and the filling material are separated by an insulating layer.

7. The resistive element of claim 5, wherein the filling material comprises polysilicon.

8. The resistive element of claim 5, wherein the insulating layer separating the resistive layer and the filling material comprises silicon oxide.

9. The resistive element of claim 1, wherein the resistive layer is formed of polysilicon or of a metal.

10. The resistive element of claim 1, wherein the resistive layer was deposited in one processing step.

11. The resistive element of claim 1, wherein the resistive layer comprises a conformal deposition of a resistive material.

12. The resistive element of claim 1, wherein the resistive layer was deposited by low-pressure chemical vapor deposition or atomic layer chemical vapor deposition.

13. The resistive element of claim 1, wherein the resistive layer comprises tantalum nitride.

14. The resistive element of claim 1, wherein the substrate comprises silicon-on-insulator.

15. The resistive element of claim 1, wherein the diameter of the holes is about one micron.

16. The resistive element of claim 1, wherein the depth of the holes is about 50 microns.

* * * * *

UNITED STATES PATENT AND TRADEMARK OFFICE
CERTIFICATE OF CORRECTION

| | | |
|---|---|---|
| PATENT NO. | : 7,902,605 B2 | Page 1 of 1 |
| APPLICATION NO. | : 12/096272 | |
| DATED | : March 8, 2011 | |
| INVENTOR(S) | : Christine Anceau | |

It is certified that error appears in the above-identified patent and that said Letters Patent is hereby corrected as shown below:

On the title page, item (73) should read:

(73) Assignees: STMicroelectronics S.A., Montrouge, France

Signed and Sealed this
Twenty-sixth Day of July, 2011

David J. Kappos
*Director of the United States Patent and Trademark Office*